United States Patent
Sheng et al.

[11] Patent Number: 5,854,109
[45] Date of Patent: Dec. 29, 1998

[54] SILICIDE PROCESS FOR MANUFACTURING A MASK ROM

[75] Inventors: Yi-Chung Sheng, Hsinchu; Cheng-Hui Chung, Hsinchu Hsien, both of Taiwan

[73] Assignee: United Microelectronics Corp., Taiwan

[21] Appl. No.: 863,626

[22] Filed: May 27, 1997

[30] Foreign Application Priority Data

Apr. 7, 1997 [TW] Taiwan .................................. 86104371

[51] Int. Cl.[6] .............................................. H01L 21/8234
[52] U.S. Cl. .......................... 438/275; 438/277; 438/279; 438/276
[58] Field of Search ..................................... 438/275, 276, 438/277, 278, 279, 290

[56] References Cited

U.S. PATENT DOCUMENTS

| | | | |
|---|---|---|---|
| 5,362,662 | 11/1994 | Ando et al. | 438/278 |
| 5,384,478 | 1/1995 | Hong | 257/385 |
| 5,504,025 | 4/1996 | Fong-Chun et al. | 438/278 |
| 5,648,289 | 7/1997 | Park | 438/278 |
| 5,688,661 | 11/1997 | Choi | 438/290 |

*Primary Examiner*—Trung Dang
*Attorney, Agent, or Firm*—Rabin & Champagne

[57] ABSTRACT

A self-aligned silicide process for the formation of a mask ROM includes forming a self-aligned silicide layer over the bit lines and the word lines to lower the resistance of the bit lines and word lines in the mask ROM.

10 Claims, 5 Drawing Sheets

Resistance($\Omega$/sq)

|  | Bit Line (0.4 $\mu$m) | Word Line (0.4 $\mu$m) |
|---|---|---|
| Prior Art | ≑100 | ≑10 |
| The Present Invention | <50 | <5 |

Table 1

SILICIDE PROCESS FOR MANUFACTURING A MASK ROM

BACKGROUND OF THE INVENTION

1. Field of Invention

This invention relates in general to a method of making read-only-memories (ROMs), and more particularly to a self-aligned silicide (SALICIDE) process used for making a mask ROM.

2. Description of Related Art

Recent advances in semiconductor manufacturing technologies has resulted in an increase in component density for ROM devices, in general, and mask ROMs in particular. Due to the necessity of mass production for a given chip size, the memory cell structure has undergone several changes throughout its history, for example, from the conventional two-state memory cell to the X-cell, then to the flat cell, and later to an improvement to the flat cell resulting in a modified flat cell structure.

In general, ROM devices utilize channel transistors as a basic memory unit. During the programming stage, impurities are selectively implanted into designated channel regions so as to adjust the threshold voltage, thus setting each memory unit to either an ON state or an OFF state.

FIG. 1 is a top view showing a conventional mask ROM. Referring to this figure, the conventional mask ROM is formed by doping N-type ions into a P-doped silicon substrate 100 to form N+ source/drain regions 104 extending in a first direction 110 and which serve as bit lines. Then, gate electrodes 106 are formed above a gate oxide layer (not shown in the figure) that covers the silicon substrate 100. The gate electrodes 106 extend in a second direction 120 and act as word lines. The first direction 110 is perpendicular to the second direction 120. A transistor channel is formed underneath the word line and between two adjacent bit lines. By setting the transistor channels in an ON/OFF state, a logic 0 or 1 is burnt into each memory unit. To obtain an OFF state, P-type impurities are implanted into designated channels, for example, channel 108 in FIG. 1, thus raising its threshold voltage. This is known as a coding implant.

However, the aforementioned conventional ROM device will have a higher word line resistance when its line width is decreased due to component miniaturization. This will have an adverse effect on its operational speed, and hence will lower its component quality.

SUMMARY OF THE INVENTION

It is therefore an object of this invention to provide a self-aligned silicide process for making a mask ROM, which lowers the resistance of both the bit lines and the word lines, and hence increases the operational speed of the components.

To achieve the object of this invention, the salicide process for a mask ROM involves forming a gate oxide layer and a first polysilicon layer sequentially above a silicon substrate. Photolithographic and etching processes are used to pattern the first polysilicon layer, and form a number of separate long polysilicon strips along a first direction. Ions are implanted into the silicon substrate not covered by the long polysilicon strips, to form a number of bit lines. A second polysilicon layer is formed above the silicon substrate, and covers both the long polysilicon strips as well as the bit lines. Photolithographic and etching processes are used to pattern the second polysilicon layer and the long polysilicon strips, and form a number of word lines along a second direction, that are perpendicular to the first direction. Spacers are formed on the sidewalls of the word lines. A metallic layer is formed above the silicon substrate. Then a high temperature is applied, and wet etching is performed to form a salicide layer above the bit lines and the word lines.

BRIEF DESCRIPTION OF THE DRAWINGS

Other objects, features, and advantages of the invention will become apparent from the following detailed description of the preferred but non-limiting embodiment. The description is made with reference to the accompanying drawings in which:

FIG. 3 is a table comparing the conventional resistance values of word lines and bit lines with those manufactured according to the present invention.

DESCRIPTION OF THE PREFERRED EMBODIMENT

Figure 1:
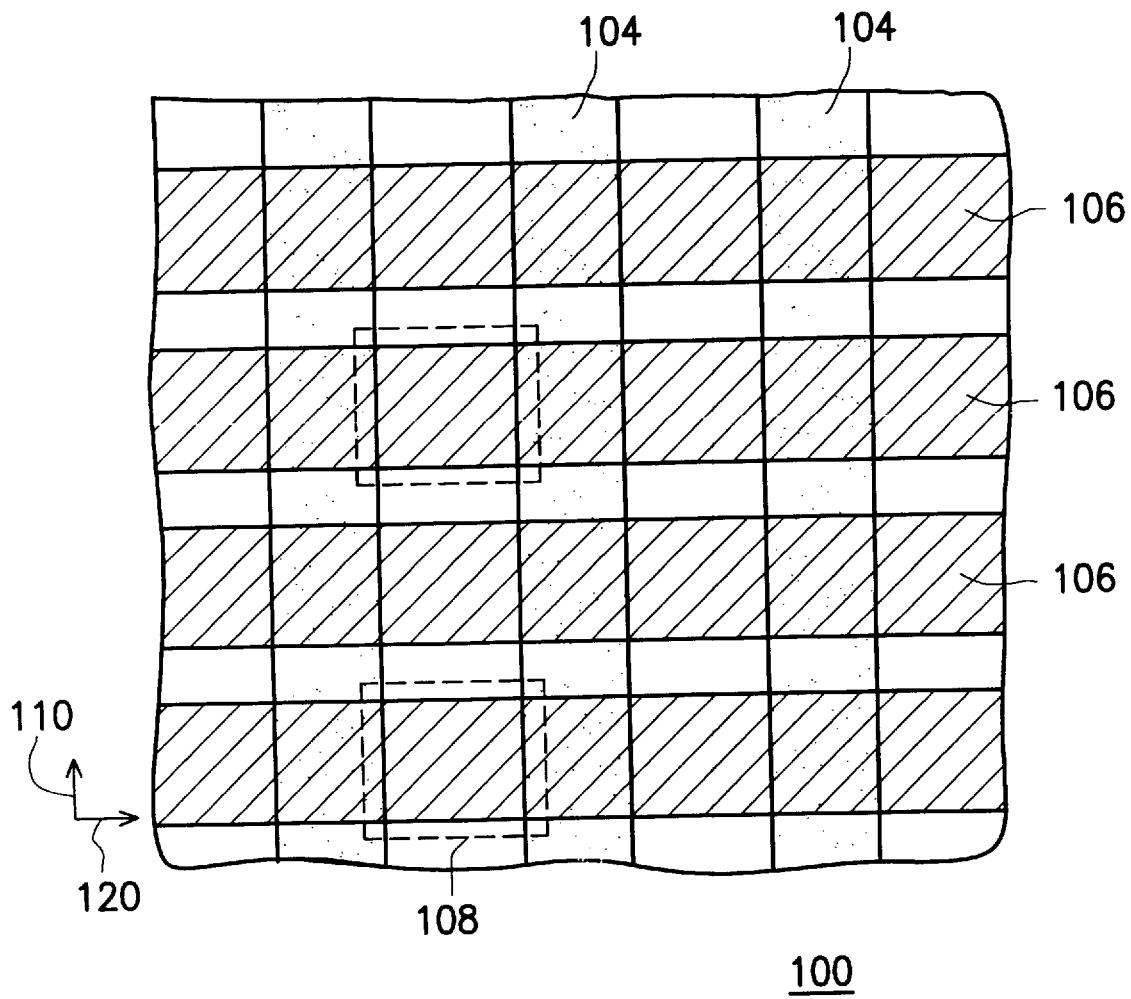
FIG. 1 is a top view of a conventional mask ROM.
Figure 2A:
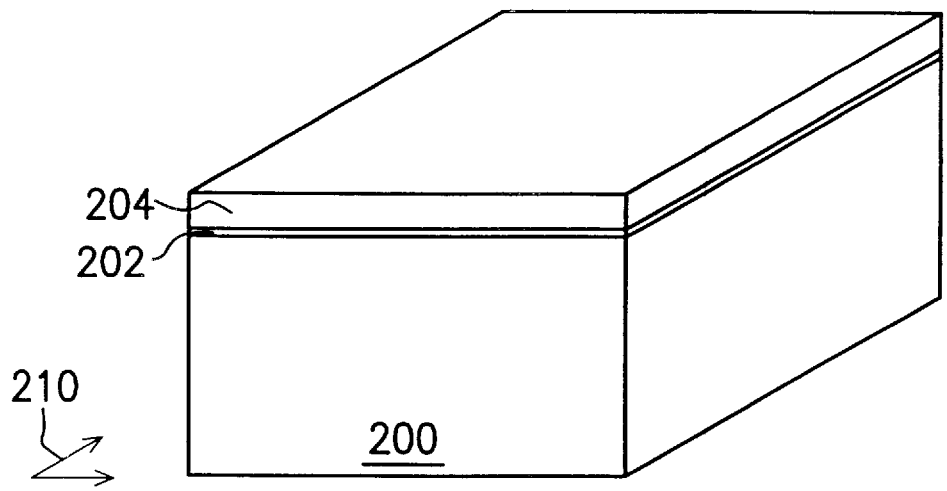
FIGS. 2A through 2F are a series of diagrams showing the processing flow of a salicide layer in a mask ROM according to this invention.

Referring to FIG. 2A, a semiconductor substrate 200 doped with a first type of ions, for example, a P-doped silicon substrate, is provided. The substrate 200 has a gate oxide layer 202 and a first polysilicon layer 204 sequentially formed thereabove. The gate oxide layer 202 can be formed using, for example, a thermal oxidation method or a chemical vapor deposition (CVD) method. The thickness of the first polysilicon layer 204 is about 300 Å to about 500 Å.

Figure 2B:
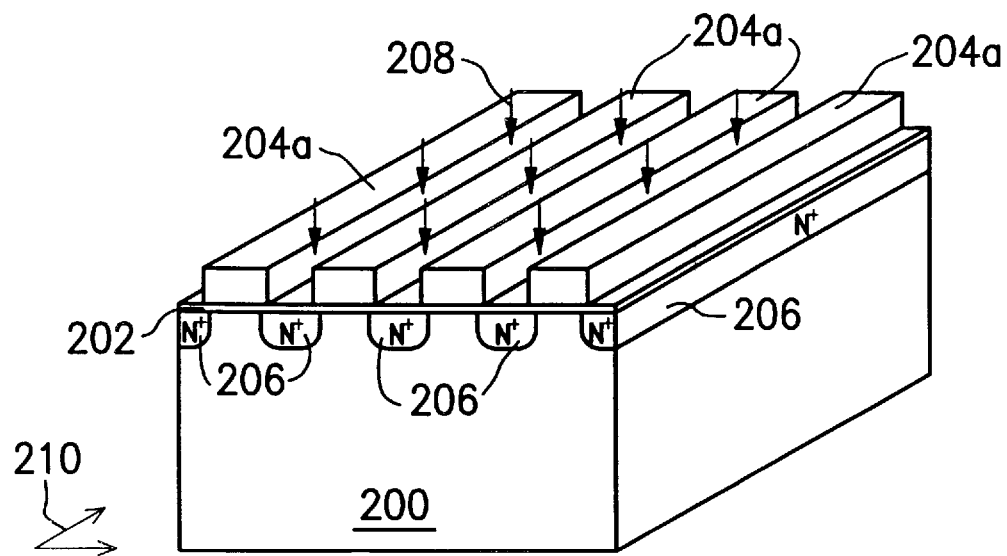

Referring next to FIG. 2B, a photolithographic process is used to define a pattern on the semiconductor substrate 200. Then, a second type of ions 208, for example, N+ ions, is implanted into the semiconductor substrate 200 through a portion of the surface not covered by a photoresist layer (not shown in the Figure). Thereafter, part of the first polysilicon layer 204 is etched away to form a number of long separate polysilicon strips 204a which extend in a first direction 210, and a number of N+ ion doped bit lines 206 which likewise extend in direction 210.

Figure 2C:
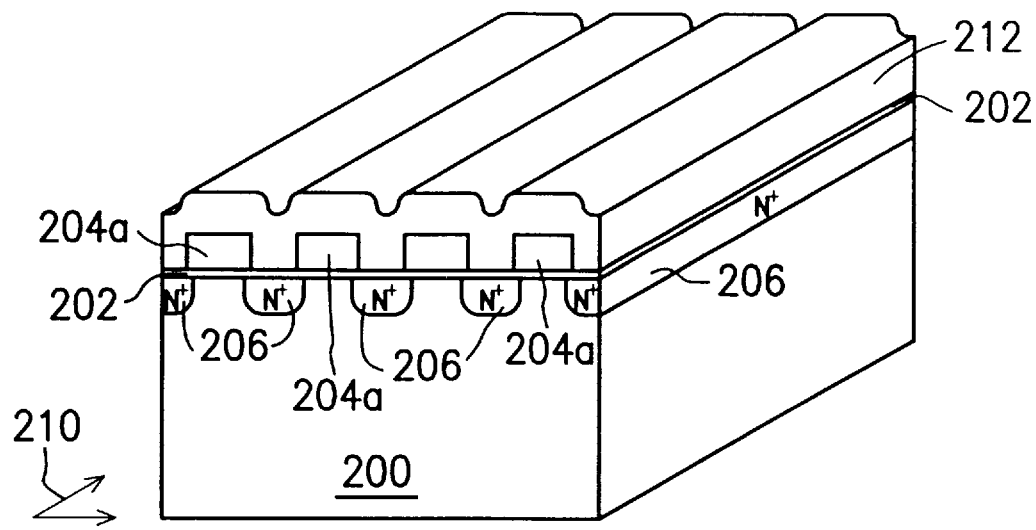

Referring next to FIG. 2C, a second polysilicon layer 212 is formed above the semiconductor substrate 200, which covers the polysilicon strips 204a and the bit lines 206.

Figure 2D:
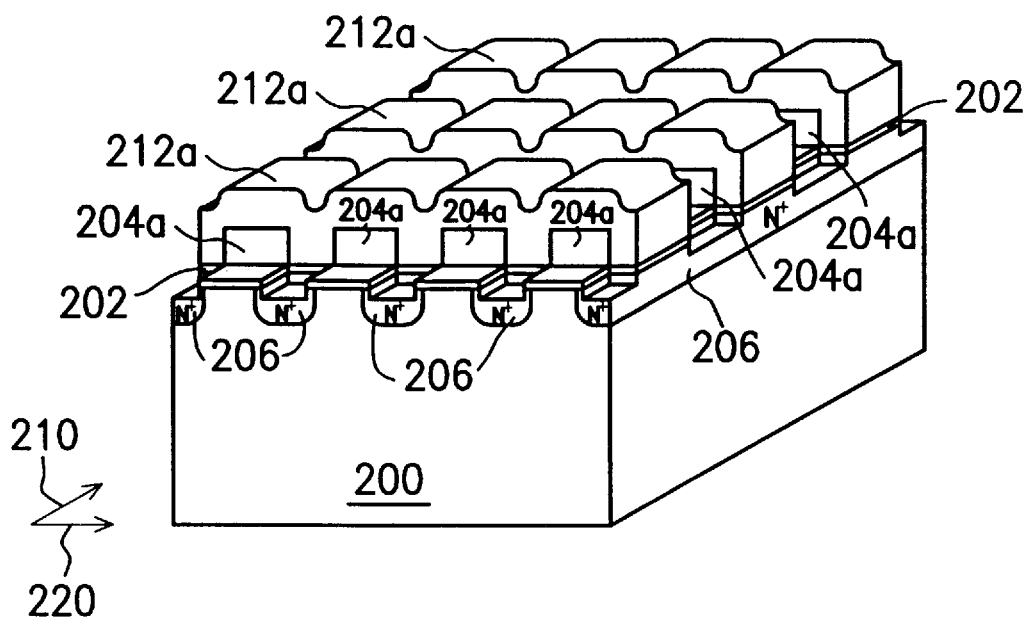

Referring next to FIG. 2D, photolithographic and etching processes are used to pattern and remove a portion of the second polysilicon layer 212 and the polysilicon strips 204a, thereby forming a number of separate word lines 212a extending in a second direction 220. The second direction 220 is perpendicular to the first direction 210. Since the bit lines 206 are protected only by the second polysilicon layer 212 thereabove, during the process of removing the polysilicon strips 204a, the portion of the gate oxide layer 202 above the bit lines 206, as well as portions of the bit lines 206 themselves, will also be removed. The extent to which the bit lines 206 are removed during etching can be controlled through adjusting a thickness of the first polysilicon layer 204.

Figure 2E:
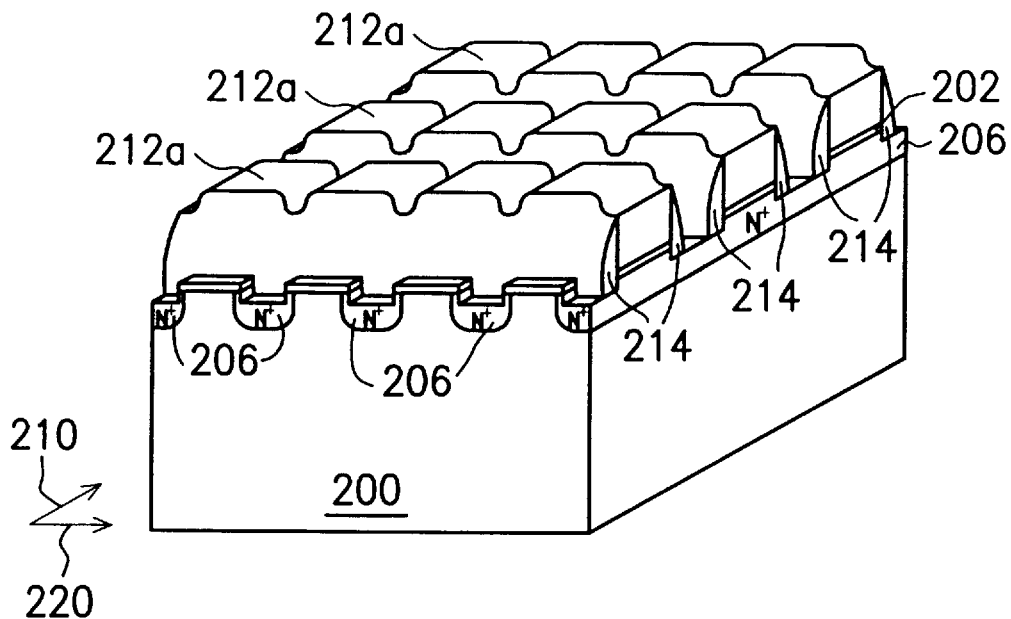

Thereafter, and referring to FIG. 2E, spacers 214 are formed on the sidewalls of each word line 212a. The spacers 214 are formed, for example, by depositing an insulating layer (not shown in the figure) above the semiconductor substrate 200, and then etching back the insulating layer.

Figure 2F:
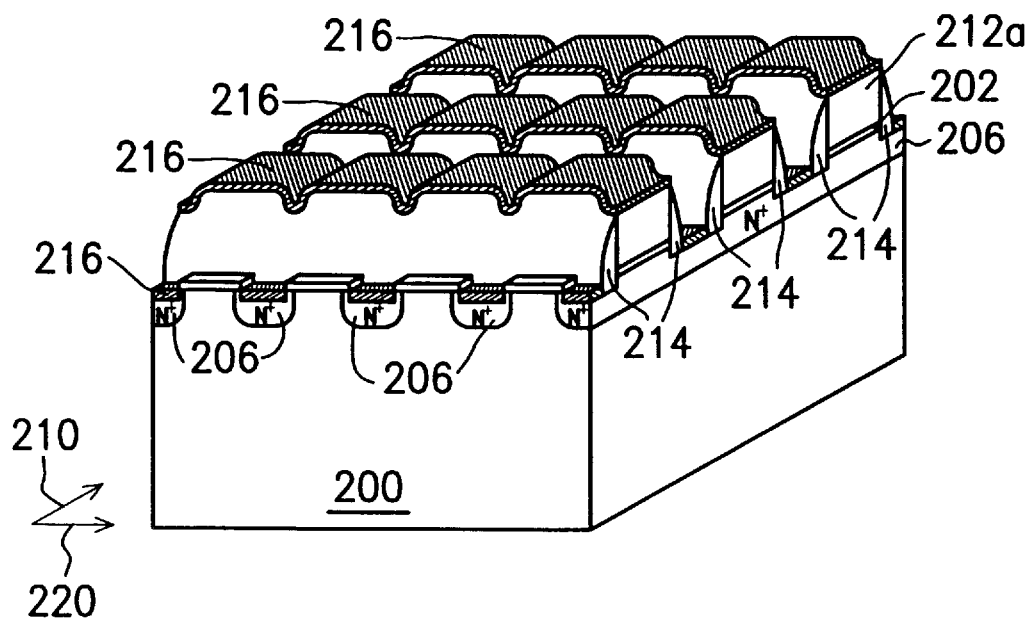

Referring to FIG. 2F, a titanium layer is formed over the bit lines 206, the spacers 214, and the word lines 212a using, for example, a sputtering method. The titanium layer has a thickness of about 300 Å to about 400 Å. Next, a rapid thermal processing (RTP) operation is performed at a temperature of 620° C. for a duration of about 30 seconds, and at a temperature of 750° C. for a duration of about 30 seconds. A portion of the deposited titanium layer is allowed to react with the polysilicon in the bit lines 206 and the word lines 212*a*, thus forming a C-49 phase titanium silicide (TiSI) structure. Subsequently, a wet etching procedure is used to remove any unreacted and residual material. This procedure is preferably an RCA cleaning operation. Then, an RTP operation is again performed using a temperature of about 825° C. for about 20 seconds to form a C-54 phase titanium silicide layer structure 216, which has a lower resistance on the surface of bit lines 206 and word lines 212*a*.

Referring to FIG. 3, Table 1 lists the resistance values of the bit lines 206 and the word lines 212*a* obtained using a conventional method versus the method according to this invention. As can be seen, there is a significant decrease in the resistance values when the method of this invention is used.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A self-aligned silicide process for forming a mask ROM, comprising:

forming a gate oxide layer and a first polysilicon layer, respectively, above a silicon substrate;

using a photolithographic process to define a pattern on the silicon substrate;

after said using a photolithographic process, implanting ions into the silicon substrate to form a plurality of bit lines on the surface of the silicon substrate, the bit lines extending in a first direction;

etching the first polysilicon layer to form a plurality of polysilicon strips extending in the first direction;

forming a second polysilicon layer above the silicon substrate, and covering both the polysilicon strips and the bit lines;

using photolithographic and etching processes to pattern the second polysilicon layer and the polysilicon strips, and forming a plurality of word lines extending in a second direction that is perpendicular to the first direction;

forming spacers on respective sidewalls of the word lines;

forming a metallic layer above the silicon substrate; and after said forming a metallic layer, using a high temperature and wet etching technique to form a salicide layer above the bit lines and the word lines.

2. The process according to claim 1, wherein said forming a gate oxide layer comprises forming the gate oxide layer and the first polysilicon layer above a P-type ion doped silicon substrate.

3. The process according to claim 1, wherein said forming a gate oxide layer comprises forming the first polysilicon layer to a thickness of about 300 Å to about 500 Å.

4. The process according to claim 1, wherein said implanting ions includes implanting N$^+$ ions.

5. The process according to claim 1, wherein said forming spacers includes depositing an insulating layer and then etching back the insulating layer to form the spacers.

6. The process according to claim 1, wherein said forming a metallic layer includes forming a titanium layer.

7. The process according to claim 1, wherein said forming a metallic layer includes using a sputtering process.

8. The process according to claim 1, wherein said using a high temperature and wet etching technique includes:

performing a first rapid thermal processing operation;

performing an RCA cleaning operation; and performing a second rapid thermal processing operation.

9. The process according to claim 8, wherein said performing a first rapid thermal processing operation includes performing the first rapid thermal processing operation at a temperatures of about 620° C. for about 30 seconds and then at about 750° C. for about 30 seconds.

10. The process according to claim 8, wherein said performing a second rapid thermal processing operation includes performing the second rapid thermal processing operation at a temperature of about 825° C. for about 20 seconds.

* * * * *